United States Patent
Toerker et al.

(10) Patent No.: US 8,063,398 B2
(45) Date of Patent: Nov. 22, 2011

(54) LIGHT-EMITTING DIODE MATRIX AND METHOD FOR PRODUCING A LIGHT-EMITTING DIODE MATRIX

(75) Inventors: Michael Toerker, Dresden (DE); Uwe Vogel, Dresden (DE); Joerg Amelung, Dresden (DE)

(73) Assignee: Fraunhofer-Gesellschaft zur Foerderung der Angewandten Forschung E.V., Munich (DE)

( * ) Notice: Subject to any disclaimer, the term of this patent is extended or adjusted under 35 U.S.C. 154(b) by 688 days.

(21) Appl. No.: 11/631,110

(22) PCT Filed: Jun. 30, 2004

(86) PCT No.: PCT/EP2004/007119
§ 371 (c)(1),
(2), (4) Date: Oct. 6, 2008

(87) PCT Pub. No.: WO2006/002668
PCT Pub. Date: Jan. 12, 2006

(65) Prior Publication Data
US 2009/0212303 A1    Aug. 27, 2009

(51) Int. Cl.
*H01L 29/08* (2006.01)

(52) U.S. Cl. .................... 257/40; 438/99; 313/505

(58) Field of Classification Search .................... 257/40; 438/99; 313/503, 505; 347/106
See application file for complete search history.

(56) References Cited

U.S. PATENT DOCUMENTS

| | | | |
|---|---|---|---|
| 5,701,055 A | 12/1997 | Nagayama et al. | |
| 6,575,800 B1 * | 6/2003 | Kobayashi et al. | 445/24 |
| 2002/0195928 A1 * | 12/2002 | Grace et al. | 313/503 |
| 2005/0190253 A1 * | 9/2005 | Duineveld et al. | 347/106 |

FOREIGN PATENT DOCUMENTS

| | | |
|---|---|---|
| WO | 03001490 A2 | 1/2003 |
| WO | 2006002668 A1 | 1/2006 |

* cited by examiner

*Primary Examiner* — Kenneth Parker
*Assistant Examiner* — Mark Tornow
(74) *Attorney, Agent, or Firm* — Dicke, Billig & Czaja, PLLC

(57) ABSTRACT

A light-emitting diode matrix comprises a substrate, first and second electrodes electrically insulated from each other formed in or on the substrate, and a first organic layer on the first electrode and a second organic layer on the second electrode. The first organic layer is separated from the second organic layer by separator means. Further, the light-emitting diode matrix comprises a cap electrode with an area disposed on the first organic layer and an area disposed on the second organic layer. The areas of the cap electrode are connected in an electrically conductive way via an area of the cap electrode disposed on the separator means.

14 Claims, 6 Drawing Sheets

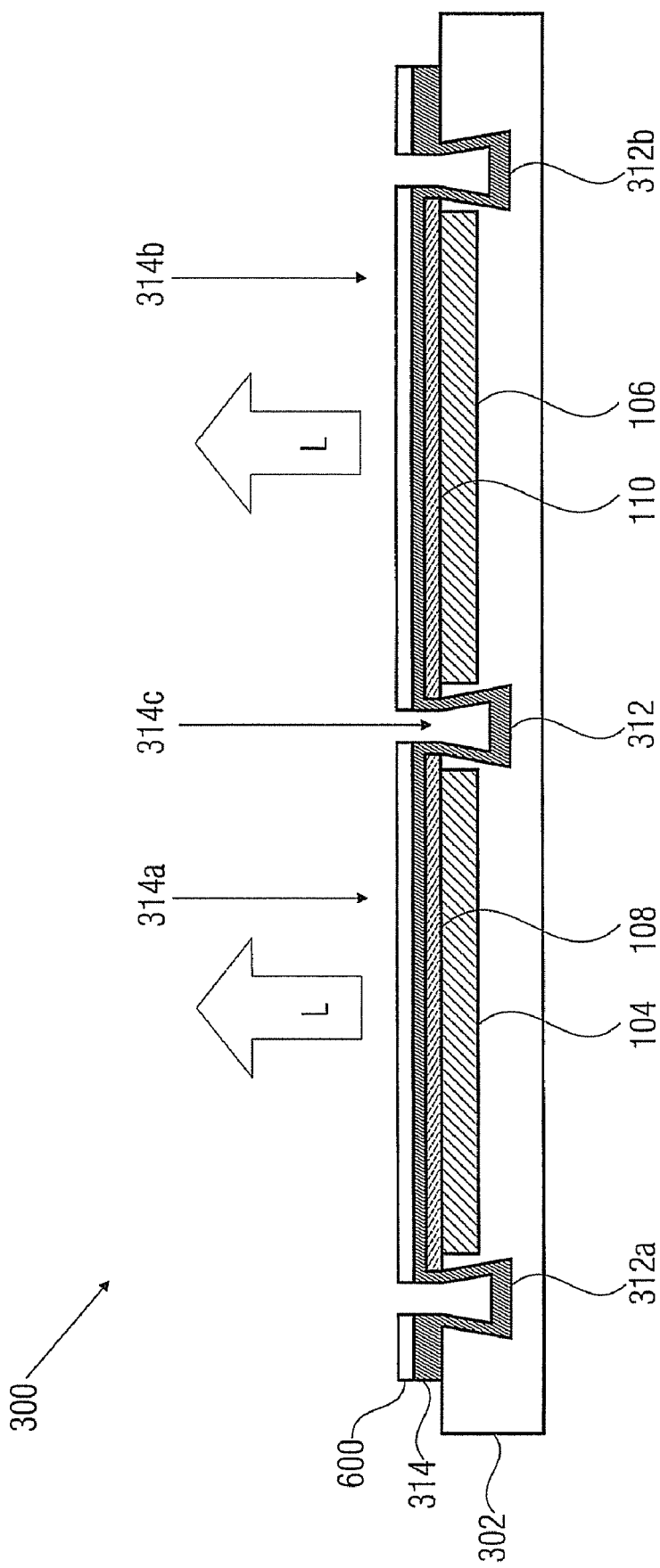

LIGHT-EMITTING DIODE MATRIX AND METHOD FOR PRODUCING A LIGHT-EMITTING DIODE MATRIX

CROSS-REFERENCE TO RELATED APPLICATIONS

This application is a continuation of copending International Application No. PCT/EP2004/007119, filed Jun. 30, 2004, which designated the United States and was not published in English.

FIELD OF THE INVENTION

The present invention relates to light-emitting diode matrices and a method for producing light-emitting diode matrices, as they are used, for example, in flat displays.

BACKGROUND

Based on organic light-emitting diodes (OLED), new flat displays with many advantages can be realized. Part of theses advantages is wide-area deposition on different substrates, self-illuminating characteristics, allowing very thin displays, a high independence of the angle of view and the potentially high efficiency of such displays.

For realizing such displays, structuring into different emitting elements, so called pixels, is required. This applies particularly for full color displays, where those pixels have to be realized such that they emit in different colors. Structuring via shadow masking technology can no longer be applied in small pixels in mini or microdisplays.

The possibility of producing such structures depends heavily on the used materials. On the one hand, organic light-emitting diodes have been realized based on polymers, which are often disposed as solutions. In that case, it is possible to perform structuring the pixels by printing methods. For example, it could be shown that efficient pixeling is possible by ink jet printing. In this pixeling technology, the resolution limit of the pixels is at approximately 50 to 100 µm. Organic light-emitting diodes of polymers, however, also have their disadvantages, for example a lower life span compared to vapor-deposited organic light-emitting diodes.

These printing techniques are not available for light-emitting diodes based on vapor-deposited materials. Further, it is important for the quality of the produced LEDs, to perform all structuring in vacuum.

U.S. Pat. No. 5,701,055 describes a possibility for obtaining structuring with integrated disruption edges, called separators below, for monochrome passive matrix displays, i.e. displays without individual control circuit. Here, both an organic layer and a cap electrode are structured by an undercut edge between individual rows.

However, for color displays it is necessary to realize selectively different colors. Conventionally, this is obtained by a lateral separation of a pixel into three subpixels for red, green and blue. In order to obtain sufficient luminosity of the pixel, every subpixel has to illuminate with threefold luminosity according to the area proportion of maximum one third of the total pixel, to represent a corresponding light-emitting diode of the overall pixel for the viewer. In the real case, the area proportion of a subpixel is at fewer than 33%. Due to the increased control, a higher current intensity is required for every pixel. Thereby, at the same time, the life span of the pixel is reduced.

A standard approach for structuring the vapor-deposited organic light-emitting diodes in the subpixels is based on evaporating colorants through a shadow mask. Such vapor-deposition through a shadow mask has been basically shown in the laboratory scale. However, the same is limited to displays with relatively low dimensions, since larger masks tend to distort. Further, such shadow masks tend to clog and block with colorants. This requires that the masks be frequently cleaned, which is a significant disadvantage in an industrial production process. Displays with subpixel sizes in the demonstration scale of up to 50 µm have already been presented. However, with smaller pixel sizes, this method can no longer be applied. Already with pixel sizes for so called minidisplays with a diagonal of more than "1", only a little area of the pixel can be used for the actual OLED, since a distance between different colors has to be maintained due to the inaccuracies of the shadow masks, in order to avoid overlapping of the subpixels.

For even higher resolutions, approaches are known, which use a realization of white emitters that are correspondingly filtered by color filters. In light-emitting diodes, which emit through the substrate, so-called substrate emitters, the filters can be applied prior to depositing light-emitting diodes on the substrate. In top emitters, the filters can be applied after depositing the light-emitting diodes. A large advantage of this method is the usage of a full-area deposition of the organic layer without having to use shadow masks. A disadvantage of this method is an efficiency loss due to the color filters and an optical and/or electrical crosstalk of neighboring pixels due to the non-structuring of the organic layers.

SUMMARY

It is an object of the present invention to provide a light-emitting diode matrix with improved operating characteristics, as well as a simplified method for producing a light-emitting diode matrix for high-resolution displays.

In accordance with a first aspect, the present invention provides a light-emitting diode matrix, having: a substrate; first and second electrodes electrically insulated from each other, formed in or on the substrate; a first organic layer on the first electrode and a second organic layer on the second electrode; a separator means separating the first organic layer from the second organic layer; a cap electrode with an area disposed on the first organic layer and an area disposed on the second organic layer, which are connected in an electrically conductive way via an area of the cap electrode disposed on the separator means.

In accordance with a second aspect, the present invention provides a method for producing a light-emitting diode matrix, having the steps of: providing a substrate; forming first and second electrodes electrically insulated from each other in or on the substrate; generating a first organic layer on the first electrode and a second organic layer on the second electrode; forming a separator means separating the first organic layer from the second organic layer; and forming a cap electrode with an area disposed on the first organic layer and an area disposed on a second organic layer, which are connected in an electrically conductive way via an area of the cap electrode disposed on the separator means.

The present invention is based on the knowledge that it advantageous to structure OLEDs, for example in active matrix displays within closed separators and to contact them through a common cap electrode. In the present invention, pixels are structured by separators, wherein a specific method of contacting the counter electrode is used. This structuring method is particularly useful for very high-resolution displays as well as for microdisplays.

The first and second organic layers can be different layers. Alternatively, for example in a white version, the first and second organic layers are one organic layer separated by separators.

The subject of this invention is a possibility to integrate monochromatic or broadband white OLEDs in an active matrix display and to obtain pixel contacting, wherein both electric and optical crosstalk is completely suppressed. The method is also suitable for very high-resolution displays and any substrate sizes.

The present invention can achieve pixeling of the OLEDs in almost any resolution, so that color displays can be produced both for minidisplays with a diagonal of more than "1" and for microdisplays.

Further, the invention requires no shadow masking structure and is thus useable in substrates of any size. Thus, the technique can also be used in normal displays and large displays. The invention can heavily increase the aspect ratio corresponding to a ratio between active subpixel area and total pixel area, which results in an increase of the life span of the OLEDs, with simultaneous visible display luminosity and further allows optimum color mixture in the pixel. Particularly, the pixels are electrically and optically insulated from each other. This reduces crosstalk of the pixels.

The inventive approach allows improved structuring possibilities in a color display, an increase of the aspect ratio of the subpixels, a lifespan improvement of the display by in-situ structuring, increased material utilization during production of the display, reduction of electric crosstalk between the pixels as well as reduction of optical crosstalk between pixels.

A further advantage of the inventive approach is that the inventive light-emitting diode matrix can be realized for every pixel as colored display through combining with color filters. Further, the light-emitting diode matrix can be implemented as substrate emitter or top emitter, respectively, depending on the implementation of the substrate or the cap electrode, respectively.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

These and other objects and features of the present invention will become clear from the following description taken in conjunction with the accompanying drawings, in which:

FIG. 6 is a cross sectional representation of a light-emitting diode matrix according to an even further embodiment of the present invention.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

In the following description of the preferred embodiments of the present invention, equal or similar reference numbers are used for the elements illustrated in the different drawings that are equal, wherein a repeated description of those elements is omitted.

Figure 1:
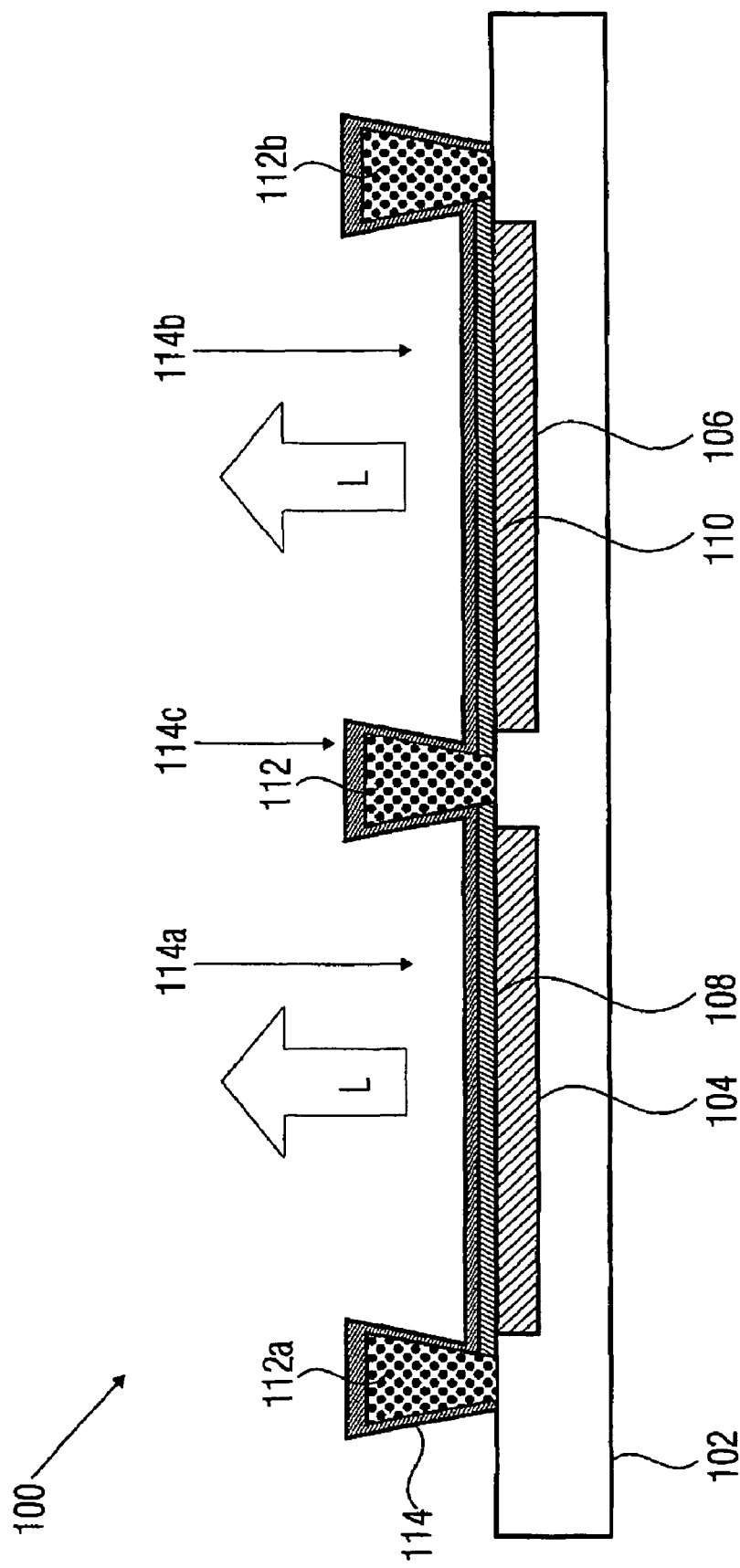
FIG. 1 is a cross sectional illustration of a light-emitting diode matrix according to an embodiment of the present invention.

FIG. 1 shows an embodiment of a light-emitting diode matrix 100 according to the present invention. The light-emitting diode matrix 100 has a substrate 102, a first electrode 104 and a second electrode 106, a first organic layer 108 and a second organic layer 110, a separator means 112 and a cap electrode 114. The cap electrode has first and second cap electrode areas 114a, 114b on the organic layers 108, 110, as well as third cap electrode area 114c for connecting the first and second cap electrode area 114a, 114b via the separator means 112.

The first electrode 104, the first organic layer 108 and an area 114a of the cap electrode 114 disposed on the first organic layer 108 form a first light-emitting diode. The second electrode 106, the second organic layer 110 and an area 114b of the cap electrode 114 disposed on the second organic layer 110 form a second light-emitting diode. The first organic layer 108 is electrically insulated from the second organic layer 110 by the separator means 112. Additionally, the organic layers 108, 110 are terminated by further separator means 112a, 112b on a side opposite to the separator means. The area 114a is connected in an electrically conductive way to the area 114b of the cap electrode 114 via an area 114c of the cap electrode 114 disposed on the separator means 112.

In this embodiment, the substrate 102 has recesses, wherein the electrodes 104, 106 are disposed. The recesses can be, for example, wells that have been introduced in the substrate 102. Alternatively, the recesses can be realized by a successive bottom-up structure. A substrate ridge is disposed between the electrodes 104, 106, which electrically insulates the electrodes 104, 106 from each other. Alternatively, the electrodes can be disposed on a substrate surface. The first organic layer 108 fully covers a side of the electrode 104 facing away from the substrate 102. Also, the second organic layer 110 fully covers a surface of the electrode 106 facing away from the substrate 102. A lateral boundary of the organic layers 108, 110, is made via the separation means 112, 112a. The cap electrode 114 fully covers both the separator means 112, 112a, 112b as well as the organic layers 108, 110.

The separator means 112, 112a, 112b is disposed on the substrate 102 in the form of a ridge. The separator means 112, 112a, 112b form a separation frame around the organic layers 108, 110. These separator means 112, 112a, 112b are preferably implemented such that they have a disruption ridge on the sides adjacent to the organic layers 108, 110. In the embodiment shown in FIG. 1, the disruption edge is realized in that the separation means 112, 112a, 112b have an undercut.

In this embodiment, the cap electrode 114 is implemented as transparent cap electrode. Thereby, the light generated in the organic layers 108, 110 is radiated through the areas 114a, 114b of the cap electrode 114. In FIG. 1, this light radiation is indicated by arrows indicated by L. In this embodiment, the cap electrode 114 is implemented in a transparent way, so that the light can exit towards the top, i.e. through the cap electrode 114. According to a further embodiment of the present invention, the cap electrode can be implemented as non-transparent cap electrode, so that the light exits in the direction of the substrate. In this case, the substrate is implemented as transparent substrate. According to a further embodiment, both substrate and cap electrode can be implemented in a transparent way, so that light can exit in both directions, which means both through the transparent substrate and through the transparent cap electrode.

In the following, a method for producing the diode matrix 100 shown in FIG. 1 will be described.

The electrodes 104, 106 are structured on the substrate 102. The electrodes 104, 106 are start electrodes of the light-emitting diodes realized in the light-emitting diode matrix 100. The electrodes 104, 106 are separated from each other by an insulating layer. Vertical separators, in FIG. 1 separator means 112, 112a, 112b, are structured around every pixel on the electrodes. In the ideal case, these separator sidewalls have an undercut. Based on this undercut, the successively deposited organic layer 108, 110 is, for example, separated by vapor-deposition. After this deposition of the organic layer 108, 110, deposition of the cap electrode 114 is performed, by using a conform deposition, for example by a PVD deposition, which allows a conductive connection across those separators 112, 112a, 112b.

Figure 2:
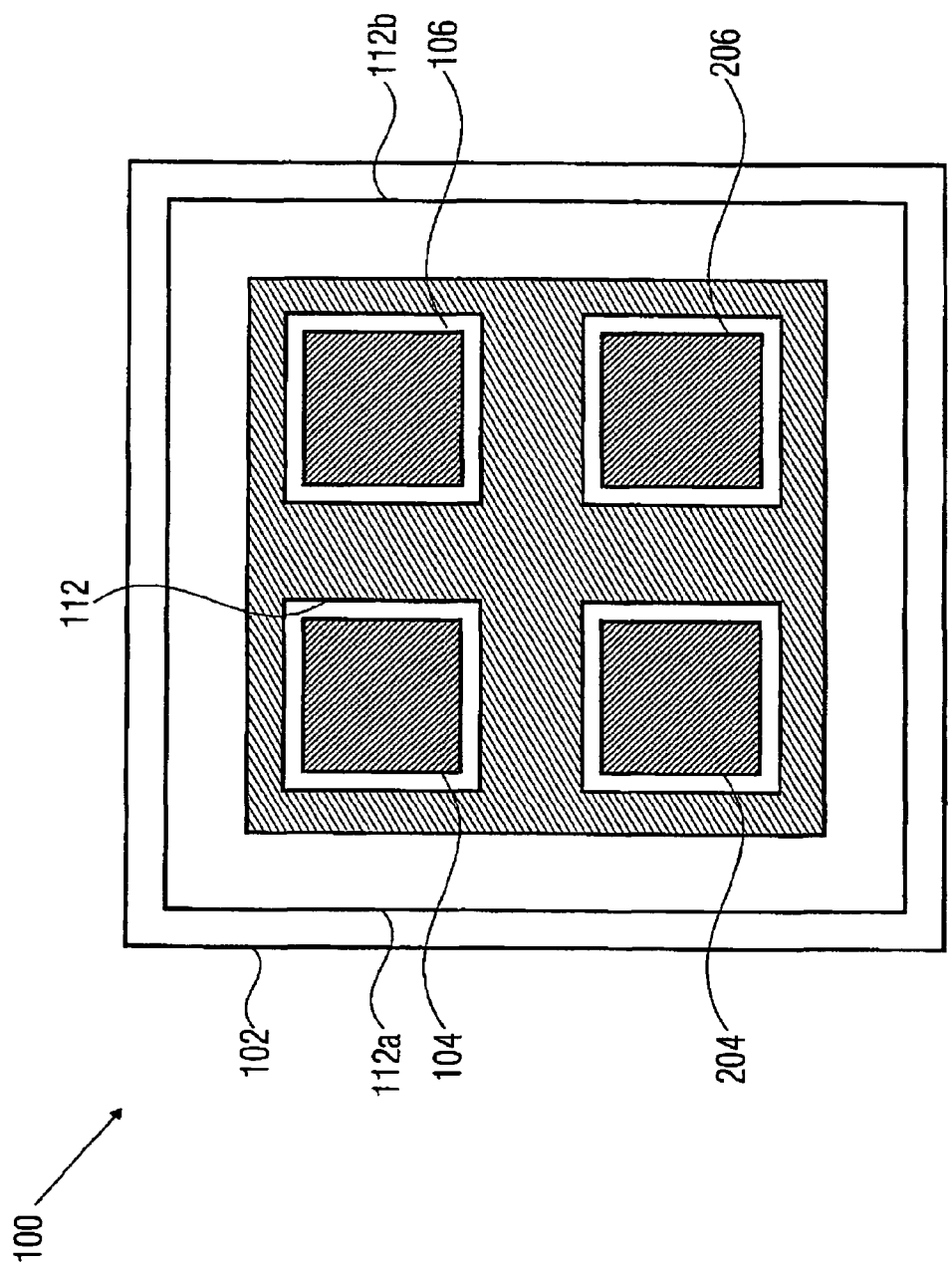
FIG. 2 is a top view of the light-emitting diode matrix shown in FIG. 1.

FIG. 2 shows the light-emitting diode matrix 100 shown in FIG. 1 in top view. The substrate 102, the electrodes 104, 106 as well as the separator means 112, 112a, 112b are shown. The light-emitting diode matrix 100 has four light-emitting diodes. FIG. 1 shows a cross sectional representation through the two light-emitting diodes disposed on the top in FIG. 2, with the first electrode 104 as well as the second electrode 106. The further light-emitting diodes disposed below in FIG. 2 have a third electrode 204 and a fourth electrode 206. FIG. 2 shows that the four light-emitting diodes of the light-emitting diode matrix 100 are surrounded by the separator means 112, 112a, 112b in a frame shape.

This separator means 100 has to be seen as sectional illustration of a light-emitting diode matrix with a plurality of light-emitting diodes.

Figure 3:
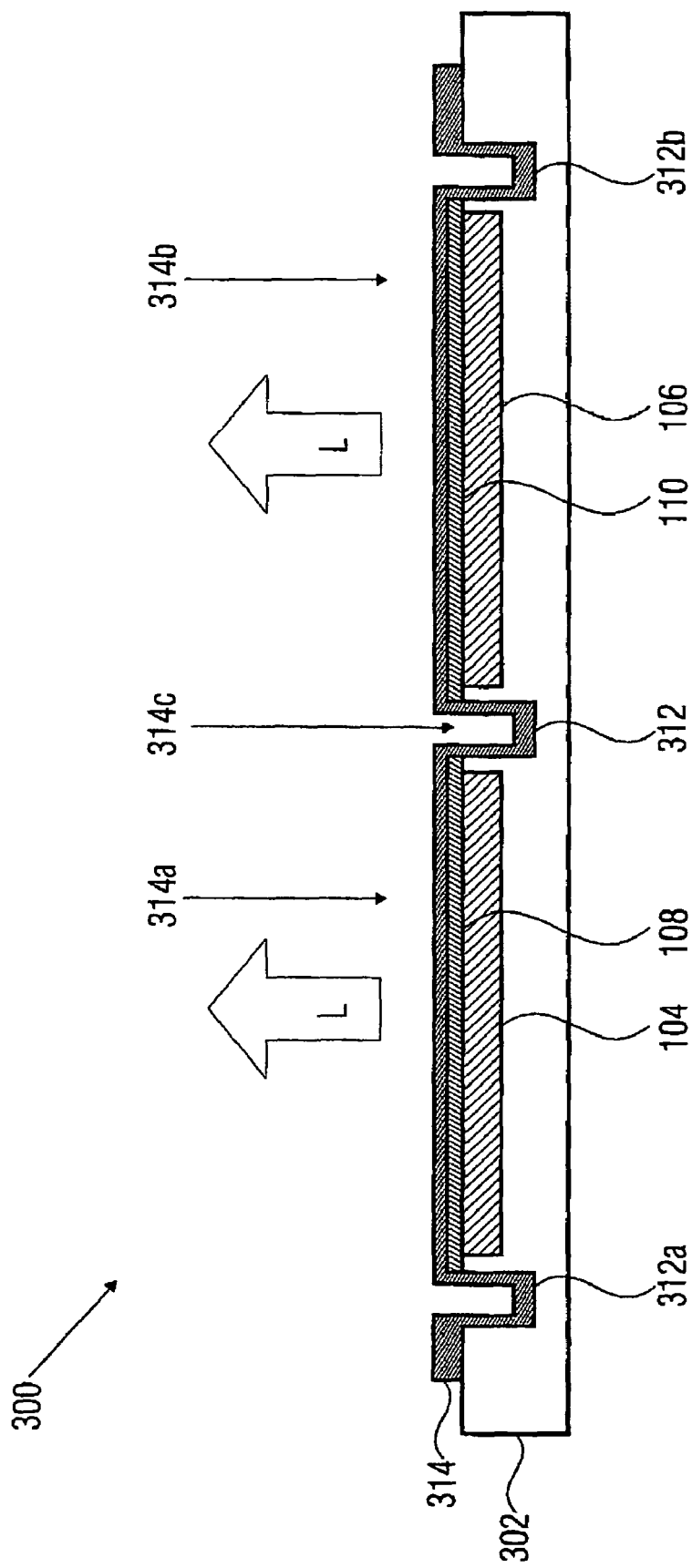
FIG. 3 is a cross sectional representation of a light-emitting diode matrix according to a further embodiment of the present invention.

FIG. 3 shows a further embodiment of a light-emitting diode matrix 300 according to the present invention. The light-emitting diode matrix 300 has a substrate 302 with electrodes 104, 106 as well as organic layers 108, 110. The organic layers 108, 110 are again separated by separator means 312, 312a, 312b. In this embodiment, the separator means 312, 312a, 312b are implemented as recesses or depressions in the substrate 302. A cap electrode 314 has a first area 314a, which is disposed over the first organic layer 108, a second area 314b, which is disposed over the second organic layer 110, and a third area 314c, which connects the first area 314a and the second area 314b of the cap electrode 314 in an electrically conductive way.

The light-emitting diode matrix 300 is produced by structuring the electrodes 104, 106 in the form of start electrodes on the substrate 302. The electrodes 104, 106 are separated from each other by an insulating layer. In this embodiment, the insulating layer is implemented by a substrate ridge between the electrodes 104, 106. Vertical separators in the form of the separator means 312, 312a, 312b are etched around every pixel in this insulating layer. In the ideal case, the separator sidewalls have an undercut. Based on this undercut, a subsequently deposited organic layer 108, 110, is separated by vapor-deposition. After this deposition of the organic layer 108, 110, deposition is performed in the cap electrode 314 by using a conform deposition, for example a PVD deposition, which allows a conductive connection across the separators.

In the shown embodiments of the present invention, OLEDs in active matrix displays are structured within closed separators and contacted by conform deposition of the cap electrode. In contrary to passive matrix displays, only the organic layer is separated by separators in this invention. For the cap electrode, conform deposition is used, which allows contacting of the whole display cap electrode. The light exits through the cap electrode or through the substrate. Control is performed by an active matrix circuit (not shown in the figures) below every pixel.

A further implementation of the described embodiments is a combination of an inventive diode matrix with color filters for every pixel, so that a color display can be realized. Therefore, in light diodes emitting through the substrate, a color filter can be deposited on the substrate prior to the deposition of the light-emitting diode. In this case, for example, a color filter layer is deposited between the substrate and electrode. Such a possibility is shown in FIG. 5, which differs from FIG. 4 in that a color filter 500 is arranged between the pixels' electrode 104 and substrate 302, respectively. In light-emitting diodes emitting through the cap electrode, a color filter can be deposited after the light-emitting diodes had been deposited. In this case, for example, a color filter layer is disposed on the cap electrode 314. Such a possibility is shown in FIG. 6, which differs from FIG. 4 in that a color filter 600 is arranged on top of electrode 314.

Figure 4:
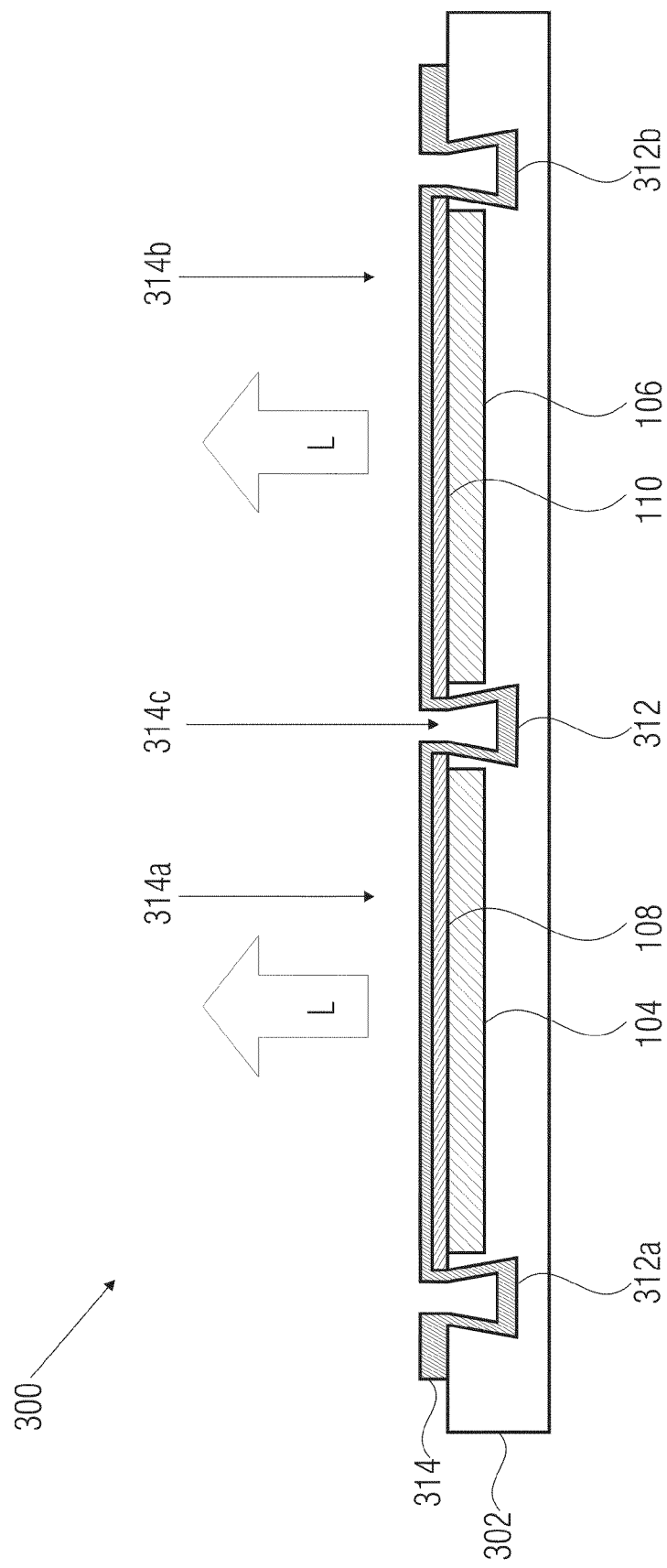
FIG. 4 is a cross sectional representation of a light-emitting diode matrix according to an even further embodiment of the present invention.
Figure 5:
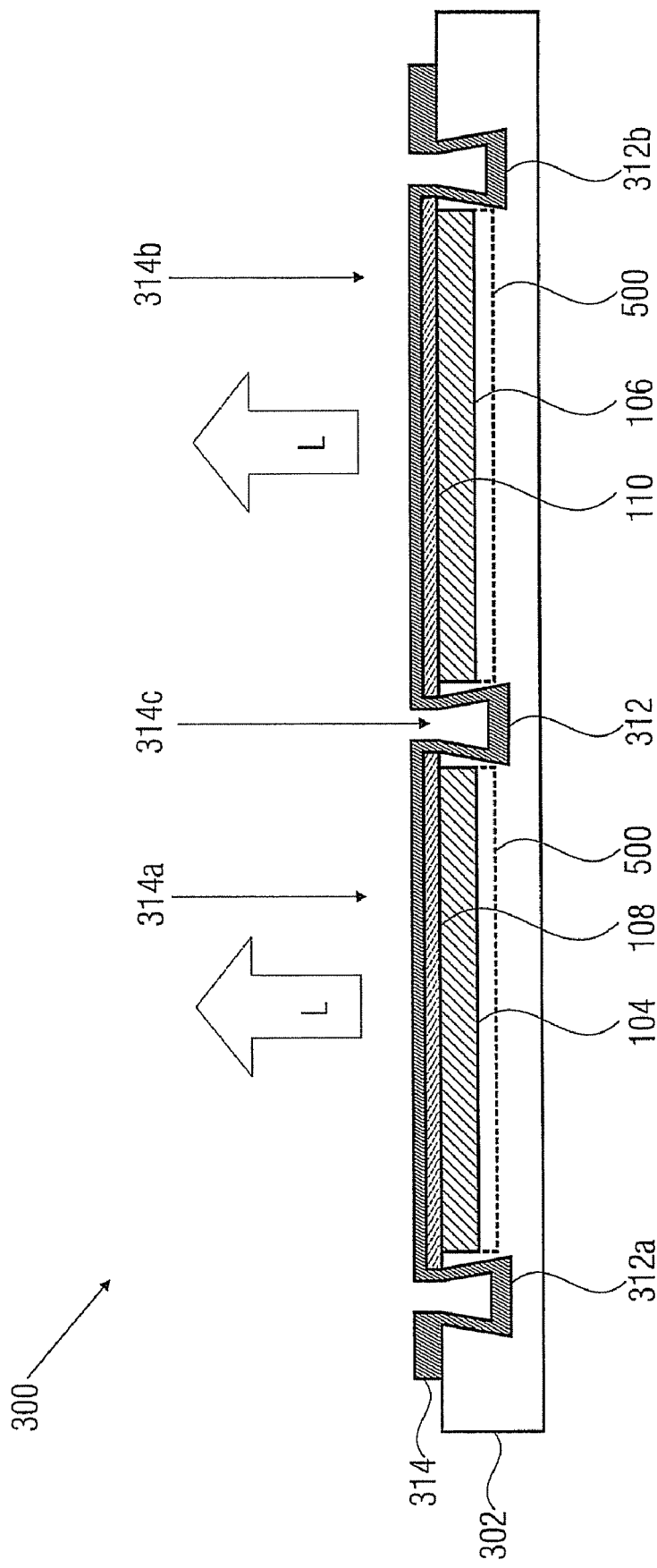
FIG. 5 is a cross sectional representation of a light-emitting diode matrix according to an even further embodiment of the present invention.

FIG. 4 shows an even further embodiment of a light-emitting diode matrix, which differs from the embodiment of FIG. 3 in that the separators have side walls with an undercut as it was the case with the separators with the embodiment of FIG. 1, for example.

The present invention describes a method for producing a display, consisting of substrate electrodes, separators of a perpendicular or undercut insulation layer, an organic layer system separated by the separation layer and a conform deposition of the cap electrode, which allows electric contacting across the separators. Thereby, light decoupling can be performed via a transparent cap electrode or via the substrate. Also, light decoupling can be performed both via a transparent substrate electrode and via a transparent cap electrode. The cap electrode can be deposited via a PVD method. Thereby, the cap electrode can consist of an indium tin oxide (ITO), of a layer sequence of indium tin oxide (ITO)/metal/indium tin oxide (ITO) or alternatively of aluminum. The inventive approach is based on structuring organic light-emitting diodes via separators for usage within active matrix displays.

While this invention has been described in terms of several preferred embodiments, there are alterations, permutations, and equivalents, which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A light-emitting diode matrix, comprising:
   a substrate;
   first and second electrodes formed, laterally spaced from each other, in or on the substrate, wherein a portion of the substrate laterally disposed between the first and second electrodes electrically insulates the first and second electrodes from each other, wherein a side of the first and second electrodes facing away from the substrate is coplanar to a surface of the portion of the substrate or the first and second electrodes are disposed on the substrate;
   a first organic layer on the first electrode and a second organic layer on the second electrode;
   a separator separating the first organic layer from the second organic layer, wherein the separator is implemented in form of a recess in the portion of the substrate electrically insulating the first and second electrodes from each other, and wherein a separator sidewall of the recess facing the first organic layer has a first disruption edge, and wherein a separator sidewall of the recess facing the second organic layer has a second disruption edge, wherein the disruption edges are realized in that the separator sidewalls have an undercut, wherein an interface of the first organic layer facing and contacting the first electrode and the substrate, respectively, extends to the first disruption edge and an interface of the second organic layer facing and contacting the second electrode and the substrate, respectively, extends to the second disruption edge;
   a cap electrode with an area disposed on the first organic layer and an area disposed on the second organic layer, which are connected in an electrically conductive way via an area of the cap electrode disposed on the separator including the separator sidewalls.

2. The light-emitting diode matrix according to claim 1, wherein the substrate comprises a first recess and a second recess, and wherein the first electrode is disposed in the first recess and the second electrode in the second recess.

3. The light-emitting diode matrix according to claim 1, wherein the cap electrode forms a first light-emitting diode together with the first organic layer and the first electrode, and a second light-emitting diode together with the second organic layer.

4. The light-emitting diode matrix according to claim 1, wherein the substrate is implemented as transparent substrate.

5. The light-emitting diode matrix according to claim 1, wherein the cap electrode is implemented as transparent cap electrode.

6. The light-emitting diode matrix according to claim 1, wherein the cap electrode is formed of indium tin oxide or of aluminum.

7. The light-emitting diode matrix according to claim 1, wherein the cap electrode has a layer sequence of indium tin oxide/metal/indium tin oxide.

8. The light-emitting diode matrix according to claim 1, further comprising a color filter disposed between substrate and electrode.

9. The light-emitting diode matrix according to claim 1, further comprising a color filter disposed on the cap electrode.

10. A method for producing a light-emitting diode matrix comprising:
    providing a substrate,
    forming first and second electrodes electrically insulated from each other in or on the substrate;
    generating a first organic layer on the first electrode and a second organic layer on the second electrode;
    forming a separator separating the first organic layer from the second organic layer, wherein the separator is implemented in form of a recess in the substrate, and wherein a separator sidewall of the recess facing the first organic layer has a first disruption edge, and wherein a separator sidewall of the recess facing the second organic layer has a second disruption edge, wherein the disruption edges are realized in that the separators have an undercut; and
    forming a cap electrode with an area disposed on the first organic layer and an area disposed on the second organic layer, which are connected to each other in an electrically conductive way via an area of the cap electrode disposed on the separator,
    wherein the first organic layer and the second organic layer are vapor-deposited on the electrodes.

11. The method of claim 10, wherein the steps of forming the first and second electrodes and the separator are performed such that the first and second electrodes are formed, laterally spaced apart from each other, in or on the substrate, wherein a portion of the substrate laterally disposed between the first and second electrodes electrically insulates the first and second electrodes from each other, wherein a side of the first and second electrodes facing away from the substrate is coplanar to a surface of the portion of the substrate or the first and second electrodes are disposed on the substrate, and wherein the organic layers are vapor-deposited on the electrodes such that an interface of the first organic layer facing and contacting the first electrode and the substrate, respectively, extends to the first disruption edge and an interface of the second organic layer facing and contacting the second electrode and the substrate, respectively, extends to the second disruption edge.

12. The method according to claim 10, wherein forming of the cap electrode is performed via conform deposition by a PVD method.

13. The method according to claim 12, wherein the forming of the cap electrode is performed via conform deposition by the PVD method such that the cap electrode is disposed on the separator including the separator sidewalls.

14. The method according to claim 11, wherein the forming of the cap electrode is performed via conform deposition by a PVD method such that the cap electrode is disposed on the separator including the separator sidewalls.

* * * * *